(12) United States Patent
Seki

(10) Patent No.: US 6,292,026 B1
(45) Date of Patent: Sep. 18, 2001

(54) SEMICONDUCTOR DEVICE AND ELECTRONIC APPARATUS USING THE SAME

(75) Inventor: Hiroshi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/565,367

(22) Filed: May 5, 2000

(51) Int. Cl.[7] .......................... H03K 19/0175; H03L 5/00
(52) U.S. Cl. ............................. 326/80; 326/16; 327/333
(58) Field of Search ................................. 326/16, 80, 63; 714/734, 724; 327/333

(56) References Cited

U.S. PATENT DOCUMENTS

| | | | |
|---|---|---|---|
| 5,317,207 | * | 5/1994 | Mortensen ............................. 326/26 |
| 5,671,234 | * | 9/1997 | Phillips et al. ...................... 714/726 |

* cited by examiner

*Primary Examiner*—Michael Tokar
*Assistant Examiner*—Daniel D. Chang
(74) *Attorney, Agent, or Firm*—Hogan & Hartson, L.L.P.

(57) ABSTRACT

A semiconductor device 100 has a peripheral cell region 102. The peripheral cell region 102 is provided with a first terminal 110, a second terminal 112 and a third terminal 120. A voltage of 3V is inputted in the first terminal 110, a voltage of 5V is inputted in the second terminal 112, and a test signal (first signal) having an amplitude of 3V is inputted in the third terminal 120. The test signal is level-shifted by a level shifter 130 to generate a second signal having an amplitude of 5 V. In the normal operation mode when the third terminal is at LOW, input terminals 202, 212, 222, 232 of first through fourth input circuits 200 through 230 are pulled up or pulled down by transistors 208, 218, 228 and 238. Even when the voltage of 5V is cut off, the input terminals 222 and 232 of the third and fourth input circuits 220 and 230 that are operated with the voltage of 3V are set in the pull-up condition or the pull-down condition by the transistors 228 and 238 that input voltages at their gates through the first transmission circuit that has buffers 124, 160, 162, 164, 170, 172 and 174.

12 Claims, 5 Drawing Sheets

SEMICONDUCTOR DEVICE AND ELECTRONIC APPARATUS USING THE SAME

BACKGROUND OF THE INVENTION

1. Field of the Invention

The present invention relates to a semiconductor device and an electronic apparatus using the same. More particularly, the present invention relates to a semiconductor device that uses two types of power supply voltages, i.e., a high power supply voltage and a low power supply voltage.

2. Description of Related Art

A conventionally known semiconductor device uses two different power supply voltages, for example, a high voltage (e.g., 5V) and a low voltage (e.g., 3V). The semiconductor device is provided with a test terminal that is used to test the acceptability of the semiconductor device before shipping. When a test signal is inputted from an outside source through the test terminal, the signal is first inputted through a buffer that is operated with a high power supply voltage to internal cells of the semiconductor device that are operated with the high power supply voltage.

In order to conduct a test on internal cells that are operated with the low power supply voltage, the test signal, that is inputted through the buffer operating with the high power supply voltage, is also supplied through a buffer that is operated with the lower power supply voltage to the internal cells operating with the low power supply voltage. In this manner, one test terminal is commonly used to receive test signals to test the plurality of internal cells that are operated with the high power supply voltage or the low power supply voltage.

In one type of semiconductor device, an input terminal of the input circuit is pulled up or down based on a logic on the test terminal in a normal operation mode, other than a test mode. In this case, a test signal may be transmitted to control the pull-up operation or the pull-down operation in a manner similar to the one described above in which a test signal is transmitted to the internal cells that are operated with the high power supply voltage or the low power supply voltage. For example, when the input terminal that receives a signal having an amplitude of a low voltage is pulled up, a test signal is transmitted through a buffer that is operated with a high power supply voltage. Then, the test signal is conducted to a gate of a transistor through a buffer that is driven with a low power supply voltage. The transistor is turned on or off to control the pull-up operation of the input terminal.

However, in recent years, transistors may be driven only with a low power supply voltage while a high power supply voltage is cut off in order to reduce the power consumption. Even in this case, a test signal is once inputted in a buffer that is driven with a high power supply voltage. However, the buffer cannot operate because the high power supply voltage is cut off. As a result, the logic of the test signal cannot be correctly transmitted to circuits that are operated with the low power supply voltage. This means that the necessary pull-up operation and pull-down operation for the input terminal cannot be accomplished when the transistors are driven only with a low power supply voltage with a high power supply voltage being cut off during the normal operation.

To solve the problems described above, independent test terminals may be provided respectively for a circuit that is driven with a high power supply voltage and a circuit that is driven with a low power supply voltage.

A semiconductor device manufacture requires test terminals. However, the user who purchases and uses the semiconductor device does not require such test terminals. Moreover, the number of external terminals of a semiconductor device is limited by the size of its circuit and the standard to be employed. Accordingly, the number of test terminals cannot readily be increased more than the presently available number.

SUMMARY OF THE INVENTION

It is an object of the present invention to provide a semiconductor device and an electronic apparatus using the semiconductor device that can select either a mode in which the device is driven with two types of power supply voltages, i.e., a high power supply voltage and a low power supply voltage, or a mode in which the device is driven only with a low power supply voltage. It is also an object of the present invention to provide a semiconductor device that has a minimum number of terminals for inputting and/or outputting signals.

It is also an object of the present invention to provide a semiconductor device and an electronic apparatus using the semiconductor device that can pull up or pull down input terminals even when the device is driven only with a low power supply voltage.

In accordance with one embodiment of the present invention, a semiconductor device include a first terminal, a second terminal, a third terminal, a level shifter, a first transmission circuit and a second transmission circuit. The first terminal receives a first power supply voltage, the second terminal receives a second power supply voltage that is greater than the first power supply voltage, and the third terminal receives a first signal having an amplitude relating to the first power supply voltage. The level shifter shifts a level of the first signal that is inputted in the third terminal based on the second power supply voltage to generate a second signal. The first transmission circuit is operated with the first power supply voltage and transmits the first signal. The second transmission circuit is operated with the second power supply voltage and transmits the second signal provided from the level shifter.

In accordance with one embodiment of the present invention, even when a high voltage, i.e., the second power supply voltage, is cut off, the first signal from the third terminal is transmitted by the first transmission circuit that is operated with the first power supply voltage. Therefore, the second power supply voltage that is a high voltage can be cut off, and yet the device can be operated only with the first power supply voltage that is a low voltage with a lower power consumption.

The semiconductor device may further includes a first control circuit that is operated by the first power supply voltage and performs control based on a logic of the first signal, and a second control circuit that is operated by the second power supply voltage and performs control based on a logic of the second signal. In this case, the first transmission circuit transmits the first signal to the first control circuit, and the second transmission circuit transmits the second signal to the second control circuit.

Accordingly, even when the second power supply voltage that is a high voltage is cut off, the first control circuit is effectively operated.

The semiconductor device may further comprise an input circuit including an input terminal that receives a third signal having an amplitude relating to the second power supply voltage. The second control circuit pulls up the input terminal to the second power supply voltage or releases the input terminal therefrom based on a logic of the second signal.

The input circuit may preferably include a buffer circuit that is operated with the first power supply voltage, and a circuit that compulsorily sets an output from the buffer circuit to the first power supply voltage when the supply of the second power supply voltage to the second terminal is cut off. As a result, even when the second power supply voltage that is a high voltage is cut off, an output from the input circuit can be fixed at a voltage that is pulled up to the first power supply voltage.

The second control circuit may include a circuit that pulls down the input terminal to a reference voltage or releases the input terminal therefrom based on a logic of the second signal. In this case, the input circuit may preferably include a buffer circuit that is operated with the first power supply voltage, and a circuit that compulsorily sets an output from the buffer circuit to the reference voltage when the supply of the second power supply voltage to the second terminal is cut off. As a result, even when the second power supply voltage that is a high voltage is cut off, an output from the input circuit can be fixed at a voltage that is pulled down to the reference voltage.

In either of the pull-up operation or the pull-down operation, the third terminal can be used as a test terminal that receives a test signal. When the test signal is set to a logic for a test mode, the second control circuit performs a release control. As a result, an input leak test can be conducted during the test mode.

A semiconductor may further comprise an input circuit including an input terminal that receives a third signal having an amplitude relating to the first power supply voltage. In this case, the first control circuit can include a circuit that pulls up the input terminal to the first power supply voltage or releases the input terminal therefrom based on a logic of the first signal. Alternatively, the first control circuit may include a circuit that pulls down the input terminal to the reference voltage or releases the input terminal therefrom based on a logic of the first signal. As a result, even when the second power supply voltage that is a high voltage is cut off, the input terminal of the input circuit can be maintained in the pull-up state or the pull-down state. In this case, the third terminal can be used as a test terminal that receives a test signal. When the test signal is set to a logic for a test mode, the first control circuit performs a release control. As a result, an input leak test can be conducted during the test mode.

Each of the first and second transmission circuits may include a buffer circuit. As a result, a correct logic can be transferred in a long transmission path in a short time.

An electronic apparatus, in accordance with another embodiment of the present invention, comprises the semiconductor device described above. The electronic apparatus includes a low power supply voltage source and a high power supply voltage source that operate the semiconductor device described above, and an operation mode that cuts off only the high voltage.

Other features and advantages of the invention will be apparent from the following detailed description, taken in conjunction with the accompanying drawings that illustrate, by way of example, various features of embodiments of the invention.

PREFERRED EMBODIMENTS

Embodiments of the present invention will be described below with reference to the accompanying drawings.

Figure 6:
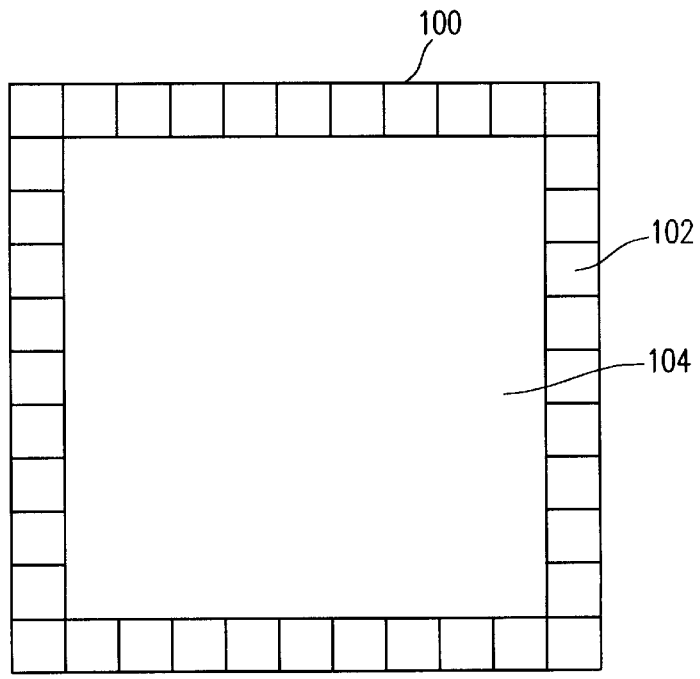
FIG. 6 shows a schematic plan view of a semiconductor device shown in FIG. 1.

FIG. 6 is a schematic plan view of a semiconductor device 100, such as a gate array, or the like. The semiconductor device 100 includes a peripheral cell region 102 and an internal cell region 104.

Many integrated MOS transistors are mounted with a high level of integration in the internal cell region 104. The MOS transistors are wired to achieve a variety of logic cells (internal cells).

The peripheral cell region 102 is provided with a function to input and output signals through signal terminals and a function to supply a power supply voltage through power supply terminals. The peripheral cell region is designed with an emphasis on its drivability. Circuits disposed in the peripheral circuit region have drivability that counters the capacity of external wirings, such as, wire bondings, as well as a protection function against electrostatics from the external terminals.

Figure 1:
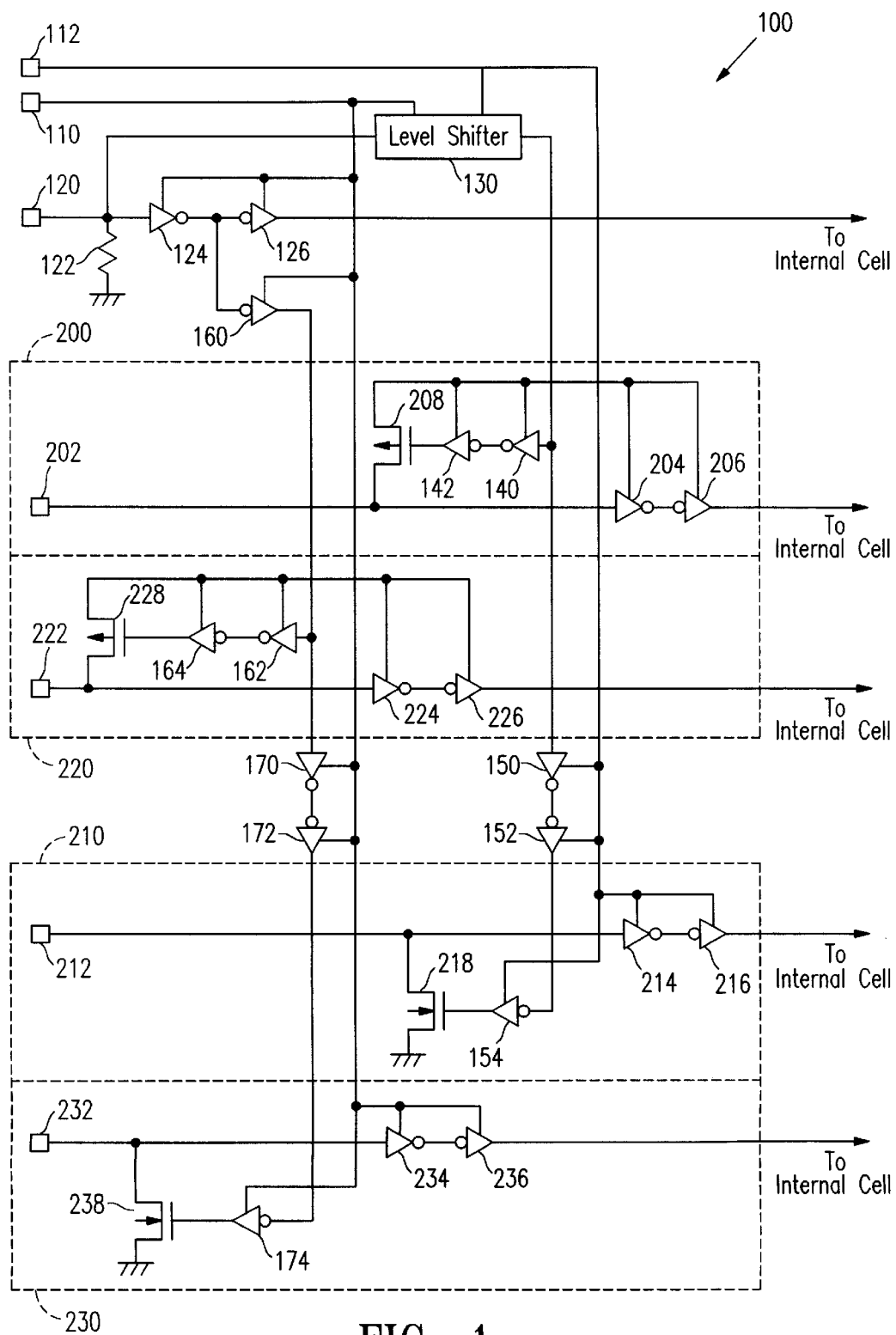
FIG. 1 shows a circuit diagram of a semiconductor device in accordance with one embodiment of the present invention.

FIG. 1 shows a circuit diagram of a part of the peripheral cell region 102 of the semiconductor device 100 of FIG. 6. The semiconductor device is driven using both of a low voltage system, for example, a first power supply voltage of 3V and a high voltage system, for example, a second power supply voltage of 5V.

Referring to FIG. 1, the semiconductor device 100 has a first terminal 110 that receives the first power supply voltage, a second terminal 112 that receives the second power supply voltage, and a third terminal that is a test terminal 120. A test signal (first signal) having an amplitude relating to the third power supply voltage (3V) is inputted in the test terminal 120 in a test mode. Also, the test terminal 120 connects to a pull-down resistor 122, such that the test terminal 120 has a voltage of 0V (LOW) in a normal operation mode other than in the test mode. A test signal that is inputted in the test terminal 120 is supplied to the internal cell region 104 through inversion buffer circuits 124 and 126 that are driven by the first power supply voltage.

Referring to FIG. 1, the semiconductor device 100 is provided with first through fourth input circuits 200, 210, 220 and 230. The first input circuit 200 transfers an input signal inputted in an input terminal 202 to the internal cell region 104 through inversion buffer circuits 204 and 206. Also, each of the second through fourth input circuits transfers an input signal inputted from each of corresponding input terminals 212, 222 and 232 to the internal cell region 104 through each of corresponding inversion buffer circuits 214, 224 and 234 and each of corresponding inversion buffer circuits 216, 226 and 236.

In this embodiment, input signals each having an amplitude relating to the second power supply voltage (5V) are inputted in the input terminals 202 and 212 of the respective first and second input circuits 200 and 210. On the other hand, input signals each having an amplitude relating to the first power supply voltage (3V) are inputted in the input terminals 222 and 232 of the respective third and fourth input circuits 220 and 230.

A P-type transistor 208 is provided to pull up a voltage on the input terminal 202 of the first input circuit 200 to the second power supply voltage. On the other hand, an N-type transistor 218 is provided to pull down a voltage on the input terminal 212 of the second input circuit 210 to a reference voltage (0V).

Similarly, a pull-up P-type transistor 228 is provided in the third input circuit 220, and a pull-down N-type transistor 238 is provided in the fourth input circuit 230.

The P-type transistors 208 and 228 and the N-type transistors 218 and 238 are turned on to pull up or pull down voltages of the respective input terminals 202, 212, 222 and 232. Also, these transistors are turned off to release the pull-up state or the pull-down state.

In the present embodiment, the logics on the single test terminal 120 are used to turn on or off the P-type transistors 208 and 228 and the N-type transistors 218 and 238. More specifically, during the normal operation mode when a test signal is not inputted in the test terminal 120, all of the P-type transistors 208 and 228 and the N-type transistors 218 and 238 are turned on, and the pull-up state or the pull-down state is released only during the test mode. In the test mode, leak tests are performed on the input signal lines that are connected to the input terminals 202, 212, 222 and 232. This is why the pull-up state or the pull-down state is released.

In order to accomplish the above, circuits are provided to transmit the logics on the test terminal 120 to the gates of the P-type transistors 208 and 228 and the N-type transistors 218 and 238.

Figure 2:
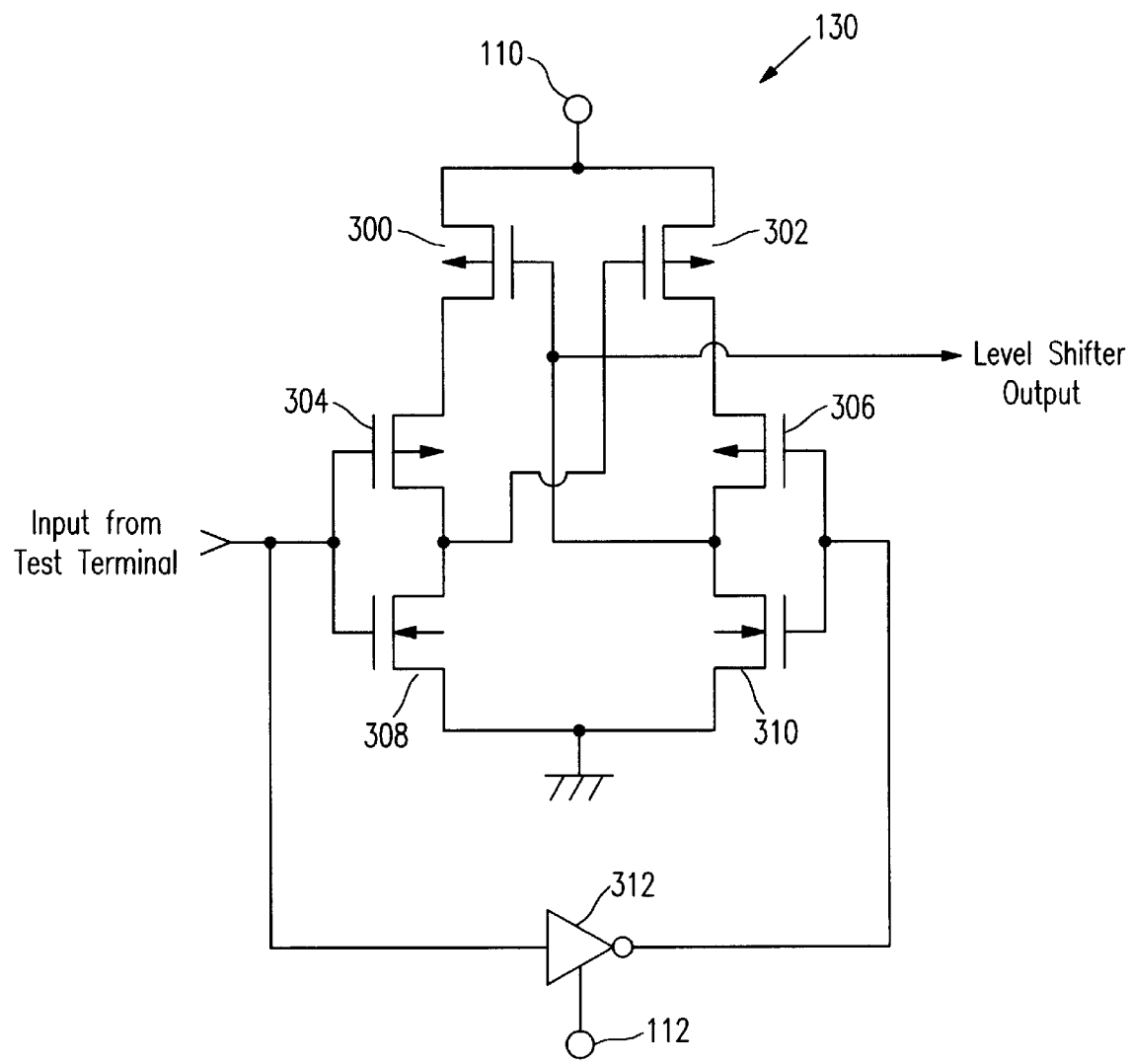
FIG. 2 shows a circuit diagram of a level shifter that is used in the semiconductor device shown in FIG. 1.

First, a level shifter 130 is provided to conduct logics on the test terminal 120 to the gate of the P-type transistor 208 in the first input circuit 200 and the gate of the N-type transistor 218 in the second input circuit 210. The level shifter 130 has a circuit structure, for example, as shown in FIG. 2. The level shifter 130 can shifts the level of a first signal that has an amplitude relating to the first power supply voltage from the test terminal 120 to a second signal that has an amplitude relating to the second power supply voltage.

In this embodiment, the level shifter 130 includes P-type transistors 300, 302, 304 and 306, N-type transistors 308 and 310 and an inversion buffer 312. The inversion buffer 312 is operated with the first power supply voltage. However, the transistors 300 through 310 are operated with the second power supply voltage. By this structure, a test signal (first signal) that is inputted in the gates of the transistors 304 and 308 has an amplitude relating to the first power supply voltage. However, the test signal can be converted by the level shifter 130 to a second signal having an amplitude relating to the second power supply voltage.

An output of the level shifter 130 is inputted in the gate of the P-type transistor 208 through inversion buffer circuits 140 and 142. On the other hand, an output of the level shifter 130 is inputted in the gate of the N-type transistor 218 through inversion buffer circuits 150, 152 and 154. As shown in FIG. 1, the inversion buffer circuits 140, 142 and 150 through 154 are driven with the second power supply voltage.

Accordingly, during the normal operation mode, the logic (LOW) on the test terminal 120 is transmitted to the gate of the P-type transistor 208, such that the voltage on the input terminal 202 of the first input circuit 200 is pulled up to the second power supply voltage. Also, the logic on the gate of the N-type transistor 218 becomes HIGH, the input terminal 212 of the second input terminal 210 is pulled down to the reference voltage (0V). In contrast, during the test mode when the logic on the test terminal 120 becomes HIGH, the P-type transistors 208 and 218 are turned off, such that the pull-up state and the pull-down state described above are released.

Next, when the logic on the test terminal 120 is conducted to the gate of the P-type transistor 228 in the third input circuit 220 and the gate of the N-type transistor 238 in the fourth input circuit 230, the following structure is used. In this case, a test signal to the test terminal 120 has an amplitude relating to the first power supply voltage (3V). Accordingly, the test signal does not need to be passed through the level shifter 130.

For this reason, the logic on the test terminal 120 is inputted in the gate of the P-type transistor 228 through inversion buffer circuits 124, 160, 162 and 164. On the other hand, the logic on the test terminal 120 is inputted to the gate of the N-type transistor 218 through the inversion buffer circuits 124, 160, 170, 172 and 174. The inversion buffer circuits 160 through 164 and 170 through 174 are driven with the first power supply voltage, as shown in FIG. 1.

By the structure described above, during the normal operation mode when the logic on the test terminal 120 is LOW, the input terminal 222 in the third input circuit 220 is set to a pull-up condition, and the input terminal 232 in the fourth input circuit 230 is set to a pull-down condition. In contrast, during the test mode when the logic on the test terminal 120 is HIGH, the pull-up condition and the pull-down condition are released.

Therefore, even when the second power supply voltage to the second terminal 112 is cut off, the pull-up operation and the pull-down operation for the input terminals 222 and 232 in the third and fourth input circuits 220,230 are not affected because the test signal is supplied to the P-type transistor 228 and the N-type transistor 238 only through the buffers that are driven with the first power supply voltage.

Figure 7:
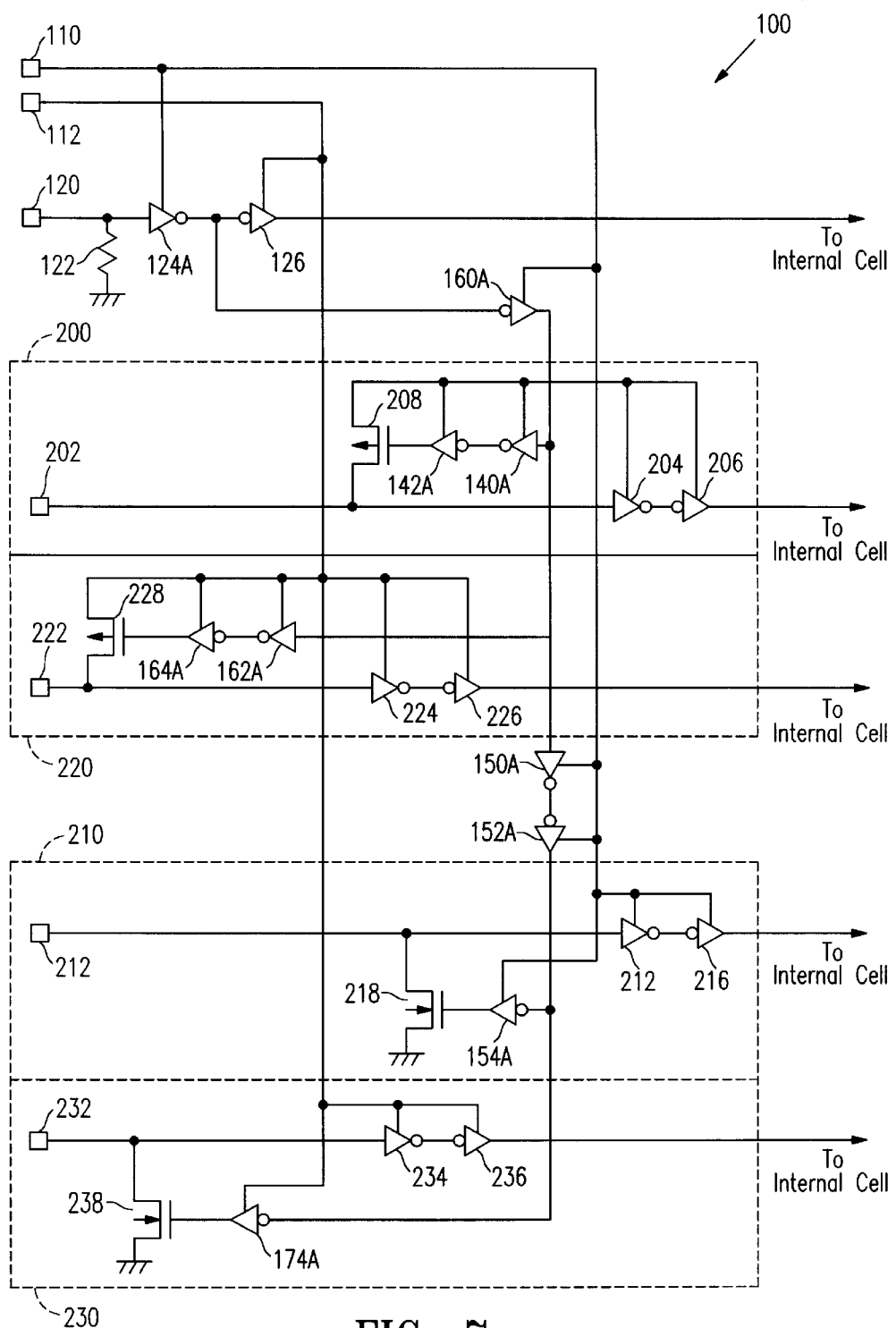
FIG. 7 shows a circuit diagram of a comparison example of a semiconductor device.

FIG. 7 shows a comparison example of a semiconductor device. Among device elements of the semiconductor device shown in FIG. 7, the same device elements as those shown in FIG. 1 are referred to by the same reference numerals. Device elements different from the corresponding device elements shown in FIG. 1 are referred to by the corresponding reference numerals each with a suffix A added thereto.

In the semiconductor device shown in FIG. 7, when the first and the second power supply voltages are supplied, the input terminals 202, 212, 222 and 232 of the first through fourth input circuits 200 through 230 are set to the pull-up condition or the pull-down condition, or these conditions can be released, in accordance with substantially the same principle employed in the semiconductor device shown in FIG. 1.

However, when the second power supply voltage is cut off, for example, in order to reduce power consumption, the inversion buffer circuits 124A, 150A, 152A and 160A that are operated with the first power supply voltage do not operate. As a result, outputs or inputs of the inversion buffer circuits 162A, 164A and 174A that are operated with the first power supply voltage are placed in the floating state. As a consequence, the pull-up control or the pull-down control over the input terminals 222 and 232 of the third and fourth input circuits 220 and 230 cannot be accomplished.

It is noted that the present invention is not limited to the embodiments described above, and a variety of modifications may be made within the scope of the subject matter of the present invention.

Figure 3:
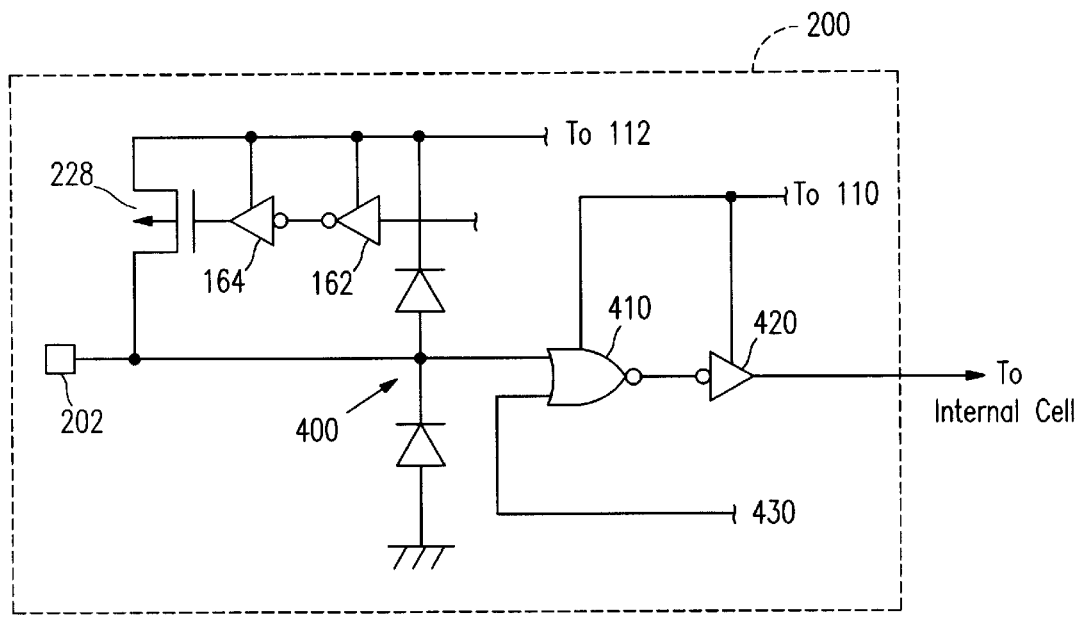
FIG. 3 shows a circuit diagram of a variation example of the first input circuit shown FIG. 1.

For example, the first input circuit 200 shown in FIG. 1 may preferably have a structure shown in FIG. 3. The first input circuit 200 shown in FIG. 3 is different from the first input circuit 200 shown in FIG. 1 in the following points.

Namely, an electrostatic protection circuit 400 is added for the input terminal 202, and a NOR gate circuit 410 and an inversion buffer circuit 420 that are driven with the first power supply voltage are provided between the input terminal 202 and the internal cells. A signal from the input terminal 202 and a control signal 430 are inputted in the NOR gate circuit 410. The control signal 430 is forcefully set to HIGH when the second power supply voltage is cut off, and is set to LOW in other circumstances.

The input terminal 202 of the first input terminal 200 is pulled up. Therefore, even when an input is not provided to the input terminal 202 during the normal operation mode, the first input circuit may preferably provide an output at a HIGH level. However, this cannot be done when the second power supply voltage is cut off because the inversion buffer circuits 204 and 206 of the first input circuit, shown in FIG. 1, are driven with the second power supply voltage.

However, in the first input circuit 200 shown in FIG. 3, when the second power supply voltage is cut off, the control signal 430 becomes HIGH. Since the NOR gate circuit 410 and the inversion buffer circuit 420 are driven with the first power supply voltage, an output from the NOR gate circuit 410 is fixed at LOW, and therefore an output from the inversion buffer circuit 420 is maintained at HIGH.

Figure 4:
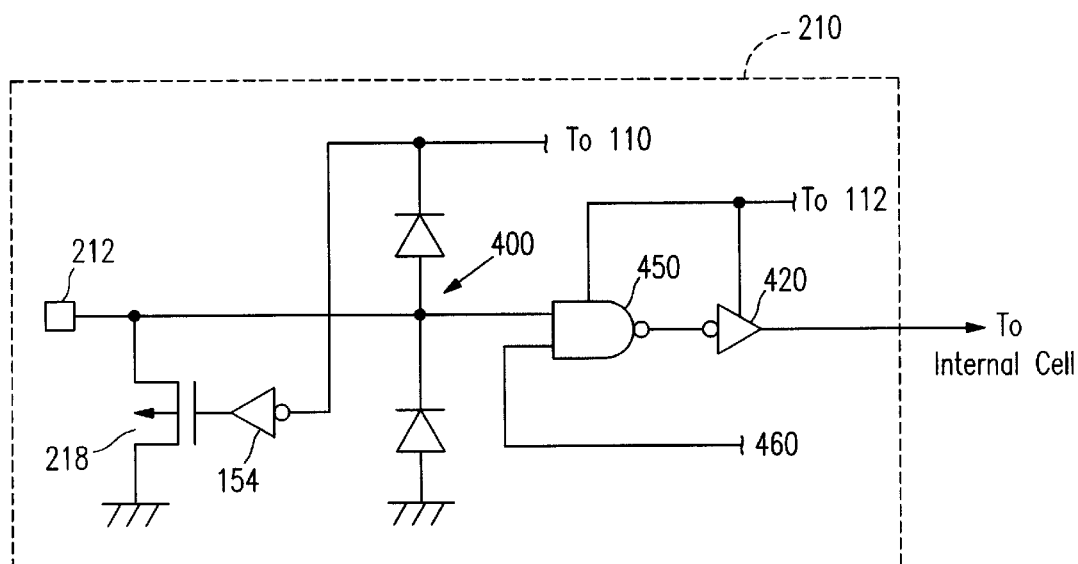
FIG. 4 shows a circuit diagram of a variation example of the second input circuit shown in FIG. 1.

For the reasons described above, the second input circuit 210 shown in FIG. 1 may preferably be change to the second input circuit 210 shown in FIG. 4. The second input circuit 210 shown in FIG. 4 has a NAND gate circuit 450 instead of the NOR gate 410 shown in FIG. 3. A control signal inputted in the NAND gate circuit 450 is compulsorily set to LOW when the second power supply voltage is cut off, and is set at HIGH in other circumstances. In the second input circuit 210, when the second power supply voltage is cut off, an output of the NAND gate circuit 450 is fixed at HIGH, such that an output from the inversion buffer circuit 420 can be maintained at LOW.

Also, in the above described embodiments, the buffer circuits are provided in transmission circuits between the test terminal 120 and the gates of the transistors 208, 218, 228 and 238. However, other logic circuits such as AND gate circuits and OR gate circuits may be used instead.

Also, in the above-described embodiments, for different types of input circuits, i.e., the first through fourth input circuits 200 through 230 are disposed in the peripheral cell region 102. However, at least one type of the input circuits may be disposed.

Figure 5:
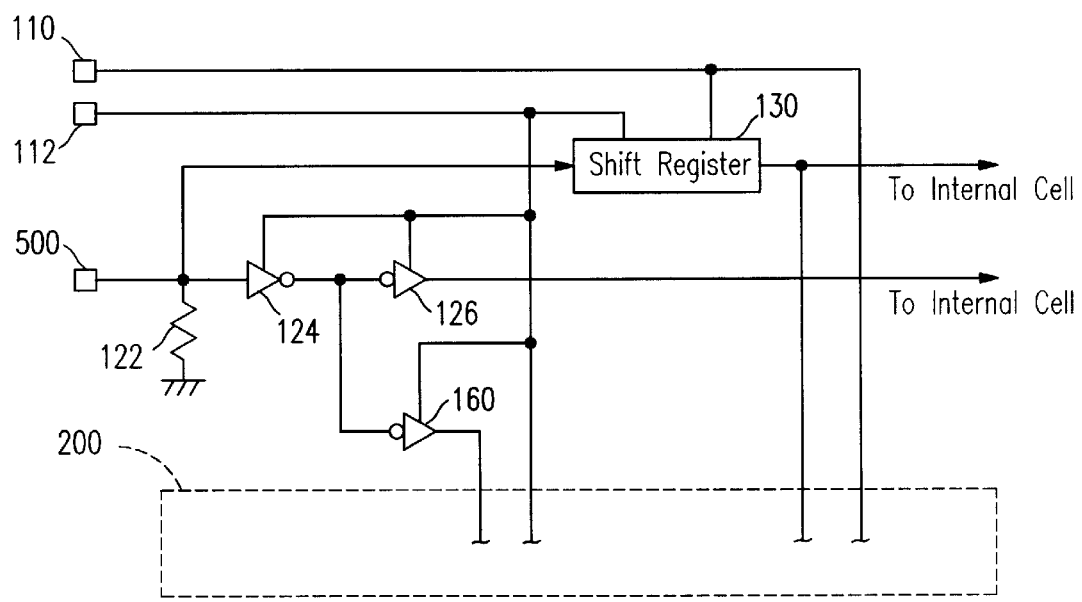
FIG. 5 shows a circuit diagram of a variation example for controlling the pull-up operation and the pull-down operation based on signals inputted in the data input terminal.

Furthermore, the test terminal is used as a control terminal that controls the pull-up operation and the pull-down operation. However, the pull-up operation and the pull-down operation may be controlled based on a signal on a data input terminal that is commonly used by two types of circuits that are driven by the first and the second power supply voltages, for example. In other words, as shown in FIG. 5, a data input terminal 500 is provided, such that an output from the level shifter 130 may be conducted to internal cells that are disposed in the internal cell region 104 and driven with the second power supply voltage.

It is noted that the present invention is also applicable to a variety of electronic apparatuses that use the semiconductor devices described above that have two types of power supply voltage sources and driven by the two power supply voltages.

While the description above refers to particular embodiments of the present invention, it will be understood that many modifications may be made without departing from the spirit thereof. The accompanying claims are intended to cover such modifications as would fall within the true scope and sprit of the present invention.

The presently disclosed embodiments are therefore to be considered in all respects as illustrative and not restrictive. The scope of the invention is indicated by the appended claims, rather than the foregoing description, and all changes which come within the meaning and range of equivalency of the claims are therefore intended to be embraced therein.

What is claimed is:

1. A semiconductor device comprising:
    a first terminal for inputting a first power supply voltage;
    a second terminal for inputting a second power supply voltage that is higher than the first power supply voltage;
    a third terminal for inputting a first signal having an amplitude relating to the first power supply voltage;
    a level shifter that shifts a level of the first signal that is inputted in the third terminal based on the second power supply voltage to generate a second signal;
    a first transmission circuit that is operated with the first power supply voltage and transmits the first signal; and
    a second transmission circuit that is operated with the second power supply voltage and transmits the second signal provided from the level shifter.

2. A semiconductor device according to claim 1, further comprising:
    a first control circuit that is operated with the first power supply voltage and performs control based on a logic of the first signal; and
    a second control circuit that is operated with the second power supply voltage and performs control based on a logic of the second signal,
    wherein the first transmission circuit transmits the first signal to the first control circuit, and the second transmission circuit transmits the second signal to the second control circuit.

3. A semiconductor device according to claim 2, further comprising an input circuit including an input terminal that receives a third signal having an amplitude relating to the second power supply voltage, wherein the second control circuit pulls up the input terminal to the second power supply voltage or releases the input terminal therefrom based on a logic of the second signal.

4. A semiconductor device according to claim 3, wherein the input circuit comprises a buffer circuit that is operated with the first power supply voltage, and a circuit that compulsorily sets an output from the buffer circuit to the first power supply voltage when the supply of the second power supply voltage to the second terminal is cut off.

5. A semiconductor device according to claim 2, further comprising an input circuit including an input terminal receives a third input signal having an amplitude relating to the second power supply voltage, wherein the second control circuit pulls down the input terminal to a reference voltage or releases the input terminal therefrom based on a logic of the second signal.

6. A semiconductor device according to claim 5, wherein the input circuit comprises a buffer circuit that is operated with the first power supply voltage, and a circuit that compulsorily sets an output from the buffer circuit to the reference voltage when the supply of the second power supply voltage to the second terminal is cut off.

7. A semiconductor device according to claim 3 or claim 5, wherein the third terminal is a test terminal that inputs a test signal, wherein when the test signal is set to a logic for a test mode, the second control circuit performs a release control.

8. A semiconductor device according to claim 2, further comprising an input circuit including an input terminal receives a third input signal having an amplitude relating to the first power supply voltage, wherein the first control circuit pulls up the input terminal to the first power supply voltage or releases the input terminal therefrom based on a logic of the first signal.

9. A semiconductor device according to claim 2, further comprising an input circuit including an input terminal that receives a third input signal having an amplitude relating to the first power supply voltage, wherein the first control circuit pulls down the input terminal to the reference voltage or releases the input terminal therefrom based on a logic of the first signal.

10. A semiconductor device according to claim 8 or claim 9, wherein the third terminal is a test terminal that inputs a test signal, wherein when the test signal is set to a logic for a test mode, the first control circuit performs a release control.

11. A semiconductor device according to claim 1, wherein each of the first and second transmission circuits includes a buffer circuit.

12. An electronic apparatus comprising a semiconductor device according to claim 1.

* * * * *